(12) United States Patent
Liu et al.

(10) Patent No.: US 6,463,013 B1
(45) Date of Patent: Oct. 8, 2002

(54) CLOCK GENERATING APPARATUS AND METHOD THEREOF

(75) Inventors: Kuo-Ping Liu, Chanzhi; Jiin Lai, Taipei; Jyh-fong Lin, Taipei; Yu-Wei Lin, Taipei, all of (TW)

(73) Assignee: Via Technologies, Inc., Taipei (TW)

( * ) Notice: Subject to any disclaimer, the term of this patent is extended or adjusted under 35 U.S.C. 154(b) by 231 days.

(21) Appl. No.: 09/631,293

(22) Filed: Aug. 2, 2000

(30) Foreign Application Priority Data

Aug. 24, 1999 (TW) .......................................... 88114438 A

(51) Int. Cl.⁷ .......................... G04F 5/00; H03B 25/00; H03L 7/06

(52) U.S. Cl. ......................... 368/155; 331/60; 327/156; 327/295

(58) Field of Search ................................. 368/118, 120, 368/155; 331/60; 327/144, 156, 295, 115

(56) References Cited

U.S. PATENT DOCUMENTS

| | | | | |
|---|---|---|---|---|
| 5,087,829 A | * | 2/1992 | Ishibashi | 327/152 |
| 5,359,727 A | * | 10/1994 | Kurita | 713/400 |
| 6,275,553 B1 | * | 8/2001 | Esaki | 375/371 |

\* cited by examiner

*Primary Examiner*—David Martin
*Assistant Examiner*—Michael L. Lindlinger
(74) *Attorney, Agent, or Firm*—Rabin & Berdo, P.C.

(57) ABSTRACT

A clock generating apparatus and method for generating clock signals of different frequency. The clock generating apparatus and method receives and divides a main clock signal to obtain a reference clock signal. Then, the reference clock signal and the first feedback clock signal are phase-locked to obtain the first clock signal. Moreover, the reference clock signal and the second feedback clock signal are phase-locked to obtain the second clock signal. The reset signal and the first clock signal are received by a divider. The divider then outputs the first feedback clock signal. Another divider receives the reset signal and the second clock signal and then outputs the second feedback clock signal.

54 Claims, 5 Drawing Sheets

CLOCK GENERATING APPARATUS AND METHOD THEREOF

BACKGROUND OF THE INVENTION

This application incorporates by reference Taiwanese application Serial No. 88114438, filed Aug. 24, 1999.

1. Field of the Invention

The invention relates in general to the clock generating apparatus and method for generating clock signals of different frequency, and more particularly to the clock generating apparatus and method that utilize low frequency oscillation to generate clock signals of different frequency which are in phase alignment.

2. Description of the Related Art

Due to the fast development of computer technologies, the internal frequency of the central processing unit, CPU, has been up to hundreds of MHz nowadays rather than several MHz before. The internal frequency of the CPU is gained by multiplying the external frequency of the CPU by a multiple. For example, a CPU's internal frequency of 266 MHz can be gained by multiplying an external frequency of 66 MHz and a multiple of 3.5. Therefore, in order to achieve higher CPU internal frequency, the motherboard of the computer should be provided with higher external frequency.

However, for the motherboards nowadays, the external frequency of the CPU may not be higher than the frequency of the other components such as memory. In general, the external frequency of the CPU may be 133 MHz, 100 MHz, or 66 MHz. For example, the frequency of memory, dynamic random access memory, DRAM, may be 133 MHz, 100 MHz, 66 MHz, or 50 MHz. And the frequency of peripheral component interconnect, PCI, may be 66 MHz or 33 MHz.

Therefore, if the motherboard can provide several frequency modes of the CPU's external frequency versus the frequency of memory, the motherboard products will be more attractive to consumers. Seven common frequency modes of the CPU's external frequency versus the frequency of the memory are as follows, 133/133, 133/100, 100/100, 100/66, 66/100, and 66/66.

As a result, a motherboard should be able to provide several kinds of clock signals to meet the needs of different frequency modes. Besides, all of the provided clock signals should be pseudo synchronous. Otherwise, when any one of the clock signals is transformed into another clock signal, the signals might get lost or be duplicated. To make the clock signals pseudo synchronous, these clock signals should be in phase alignment. That is to say, the first phase signal of all clock signals should be all at the high level or at the low level. The meaning of the phase alignment is illustrated in FIG. 1. As shown in FIG. 1, two clock signals CLK-A and CLK-B are taken as an examples for illustration and the frequency ratio of the two is about 3:2. Suppose the frequency of CLK-A and CLK-B are 100 MHz and 66 MHz, respectively. The clock signal CLK-A is provided with three phase signals PH1A, PH2A, and PH3A. Similarly, the clock signal CLK-B is provided with two phase signals PH1B, and PH2B. When the clock signal is enabled, it is at high level. The three phase signals PH1A, PH2A, and PH3A of the clock signal CLK-A are in turn enabled. That is to say, the phase signal PH1A is enabled in the first period of the clock signal CLK-A. The phase signal PH2A is enabled in the second period of the clock signal CLK-A. And, the phase signal PH3A is enabled in the third period of the clock signal CLK-A. Likewise, the two phase signals PH1B and PH2B of the clock signal CLK-B are in turn enabled.

Referring to FIG. 1, phase alignment of the clock signals CLK-A and CLK-B means that the first phase signals PH1A and PH1B of the two clock signals CLK-A and CLK-B are enabled at the same time. Namely, when the first phase signals of a number of clock signals are enabled at the same time, these clock signals are in phase alignment.

It is important to achieve the pseudo synchrony of clock signals of different frequency because the transformation between the clock signals of different frequency is correct only when the clock signals are in pseudo synchrony. If they are not in pseudo synchrony, errors such as signal loss or multiple transformations may occur. The pseudo synchrony of different clock signals can be achieved only when the phase alignment of the clock signals is achieved.

Conventionally, a phase-locked loop, PLL, is utilized to generate clock signals of different frequency. Referring to FIG. 2, the block diagram of a conventional PLL is illustrated. As shown in FIG. 2, the PLL 200 includes a phase detector 210, a low-pass filter 220, and a voltage-controlled oscillator, VCO, 230.

Referring to FIG. 2, the divider 202 is utilized to divide the input signal FIN by D and output a base band signal FIN/D, D is an integer. In the following paragraphs, the above-mentioned divider is called Divide-by-D divider. Therefore, a divider dividing the input signal by N is called Divide-by-N divider. The base band signal FIN/D is transmitted through the phase detector 210, the low-pass filter 220, and the VCO 230. After the PLL 200 is locked, the VCO 230 outputs an output signal FOUT. Then, the output signal FOUT is fed back to the phase detector 210 by a Divide-by-N divider 204. That is to say, the Divide-by-N divider 204 outputs a base band signal FOUT/N to the phase detector 210. Therefore, The two base band signals FIN/D and FOUT/N have the following relationship:

$$FOUT/N=FIN/D.$$

Then, FOUT=(N/D)×FIN. Therefore, by appropriately dividing the output signal of the PLL 200, various clock signals can be obtained. And the phases of clock signals of different frequency can be in phase alignment through the use of a reset signal (not shown in the FIG.).

As mentioned above, with the properly chosen input signal and dividers, clock signals of different frequency can be obtained. For example, when the input signal FIN is 100 MHz, D=3, and N=12, the output signal FOUT=(N/D)× FIN=(12/3)×100 MHz=400 MHz. Then, a clock signal of 133 MHz can be obtained by dividing the output signal FOUT by 3.

Generally speaking, the output signal FOUT and the input signal FIN are multiples of a basic clock signal. For example, 133 MHz, 100 MHz, and 66 MHz are four times, triple, and twice of 33 MHz, respectively.

Conventionally, the output signal FOUT should be higher than 400 MHz to meet the needs of generating different clock signals. For example, 133 MHz is obtained by dividing the output signal of 400 MHz by 3. In the same way, 100 MHz and 66 MHz are obtained by dividing 400 MHz by 4 and 6, respectively. However, the effect of the oscillation of the VCO produced by the present semiconductor techniques is not steady enough. Therefore, errors may occur.

To prevent the VCO of the PLL from oscillating in the high frequency, two or more PLLs are utilized to generate output signals of different frequency conventionally. However, utilizing a number of PLLs to generate clock signals of different frequency raises other problem. That is, the clock signals generated by these PLLs are not in phase alignment. Therefore, errors, such as signal loss, may occur while the clock signals are transmitted.

It is therefore an object of the invention to provide a clock generating apparatus and method, wherein clock signals of different frequency can be generated by appropriately combining the reset signal, dividers, and PLLs. Besides, the clock signals generated are all in phase alignment with the main clock signal. Moreover, the PLLs are not oscillated at high frequency, which means that the clock generating apparatus is more stable.

The invention achieves the above-identified objects by providing a clock generating apparatus for receiving a main clock signal and a reset signal and outputting a number of clock signals. The main clock signal is provided with m phase signals, m is an integer. The m phase signals are enabled in turn during the m periods of the main clock signals. Each of the m phase signals is enabled in one period of the main clock signal. Besides, the reset signal is enabled when the $m^{th}$ phase signal of the main clock signal is enabled. The clock generating apparatus includes five dividers and the first phase-locked loop (PLL). The first divider is used for receiving the main clock signal and the reset signal. After the first divider is reset by the reset signal, the first divider divides the main clock signal and outputs a reference clock signal when the first phase signal of the main clock signal is enabled. The first PLL, is used for receiving the reference clock signal and the first feedback clock signal. The first PLL outputs the first clock signal after the reference clock signal and the first feedback clock signal are phase-locked. The second dividers used for receiving the reset signal and the first clock signal. After the second divider is reset by the reset signal, the second divider divides the first clock signal and outputs the third clock signal when the first phase signal of the main clock signal is enabled. The third divider is used for receiving the reset signal and the second clock signal. After the third divider is reset by the reset signal, the third divider divides the second clock signal and outputs the forth clock signal when the first phase signal of the main clock signal is enabled. The forth divider is used for receiving the reset signal and the third clock signal. After the forth divider is reset by the reset signal, the forth divider divides the third clock signal and outputs the first feedback clock signal when the first phase signal of the main clock signal is enabled. The fifth divider is used for receiving the reset signal and the forth clock signal. After the fifth divider is reset by the reset signal, the fifth divider divides the forth clock signal and outputs the second feedback clock signal when the first phase signal of the main clock signal is enabled. Furthermore, the frequency of the first feedback clock signal and the second feedback clock signal are the same as that of the reference clock signal. Besides, the third clock signal, the forth clock signal, and the main clock signal are in phase alignment.

The invention achieves the above-identified objects by providing a clock generating method for receiving a main clock signal and a reset signal and outputting a number of clock signals. The clock generating method includes the following steps. First, m phase signals are generated, m is an integer. The period of each of the m phase signals is m times of the period of the main clock signal. Besides, each of the m phase signals is enabled during one period of the main clock signal. Furthermore, the reset signal is enabled when the m phase signal is enabled.

Second, the main clock signal and the reset signal are received by the first divider. After the first divider is reset by the reset signal, the first divider divides the main clock signal and outputs a reference clock signal when the first phase signal is enabled.

Then, the reference clock signal and the first feedback signal are received by the first phase-locked loop (PLL). After the reference clock signal and the first feedback clock signal are phase-locked, the first PLL outputs the first clock signal.

Next, the reference clock signal and the second feedback signal are received by the second PLL. After the reference clock signal and the second feedback clock signal are phase-locked, the second PLL outputs the second clock signal.

Then, the reset signal and the first clock signal are received by the second divider. After the second divider is reset by the reset signal, the second divider divides the first clock signal and outputs the first feedback clock signal when the first phase signal is enabled.

Next, the reset signal and the second clock signal are received by the third divider. After the third divider is reset by the reset signal, the third divider divides the second clock signal and outputs the second feedback clock signal when the first phase signal is enabled.

Then, the reset signal and the third clock signal are received by the forth divider. After the forth divider is reset by the reset signal, the forth divider divides the third clock signal and outputs the third clock signal when the first phase signal is enabled.

Finally, the reset signal and the forth clock signal are received by the fifth divider. After the fifth divider is reset by the reset signal, the fifth divider divides the forth clock signal and outputs the forth clock signal when the first phase signal is enabled.

The frequency of the first feedback clock signal and the second feedback clock signal are the same as that of the reference clock signal. Furthermore, the third clock signal, the forth clock signal, and the main clock signal are in phase alignment.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1:
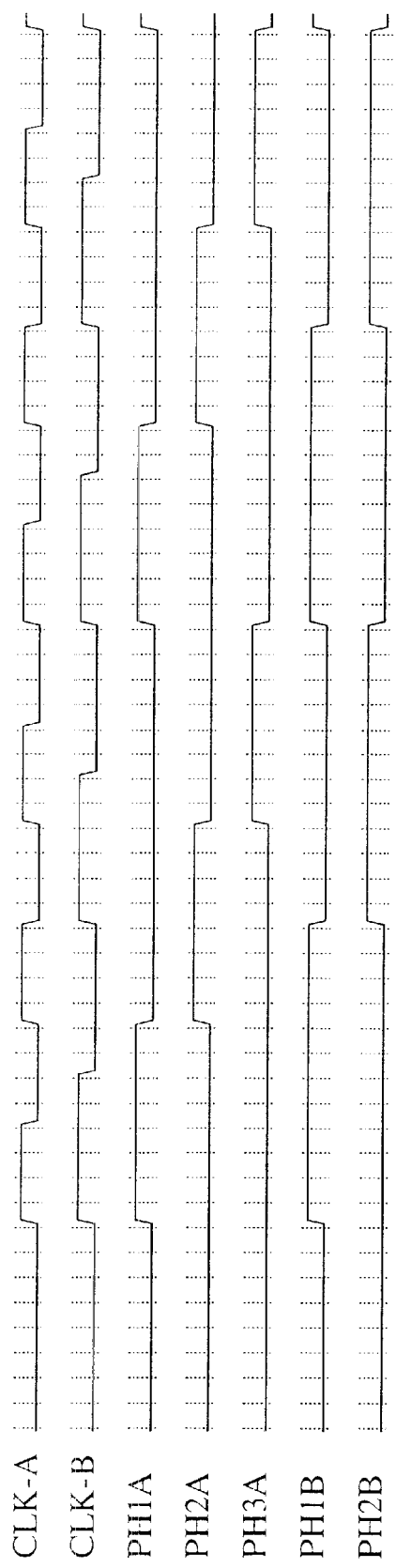
FIG. 1 (Prior Art) shows the timing chart of the clock signals and their phase signals.
Figure 2:
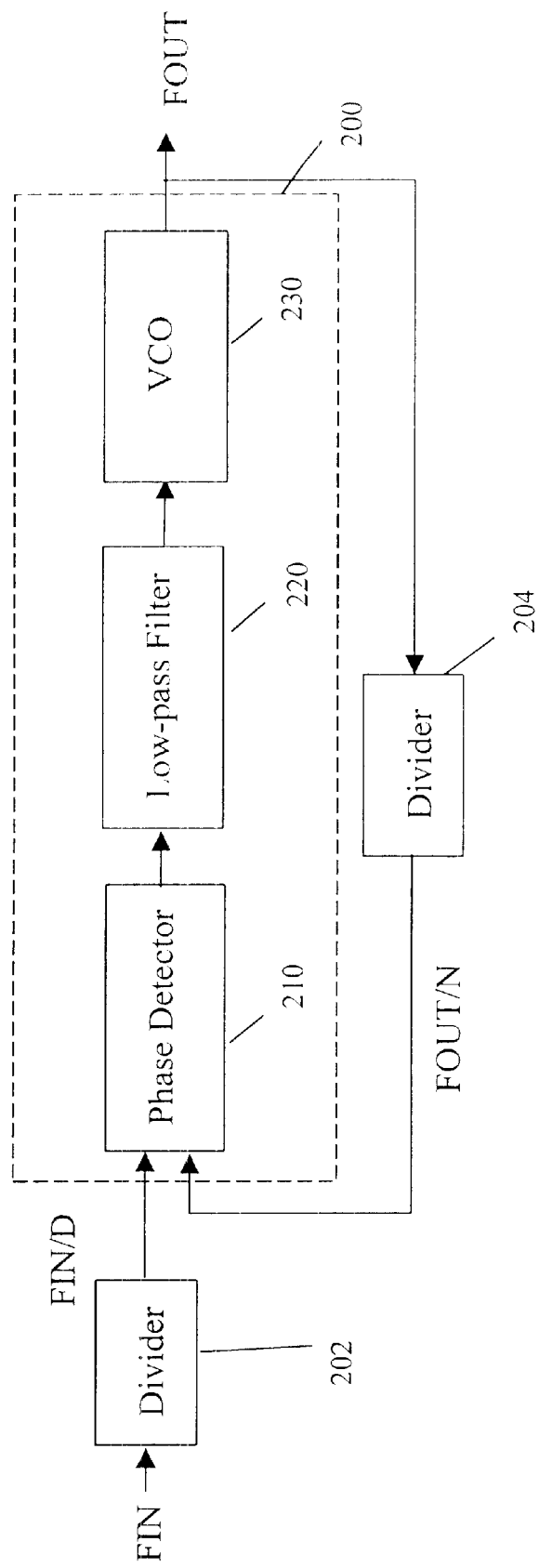
FIG. 2 (Prior Art) shows the block diagram of a conventional PLL.
Figure 3:
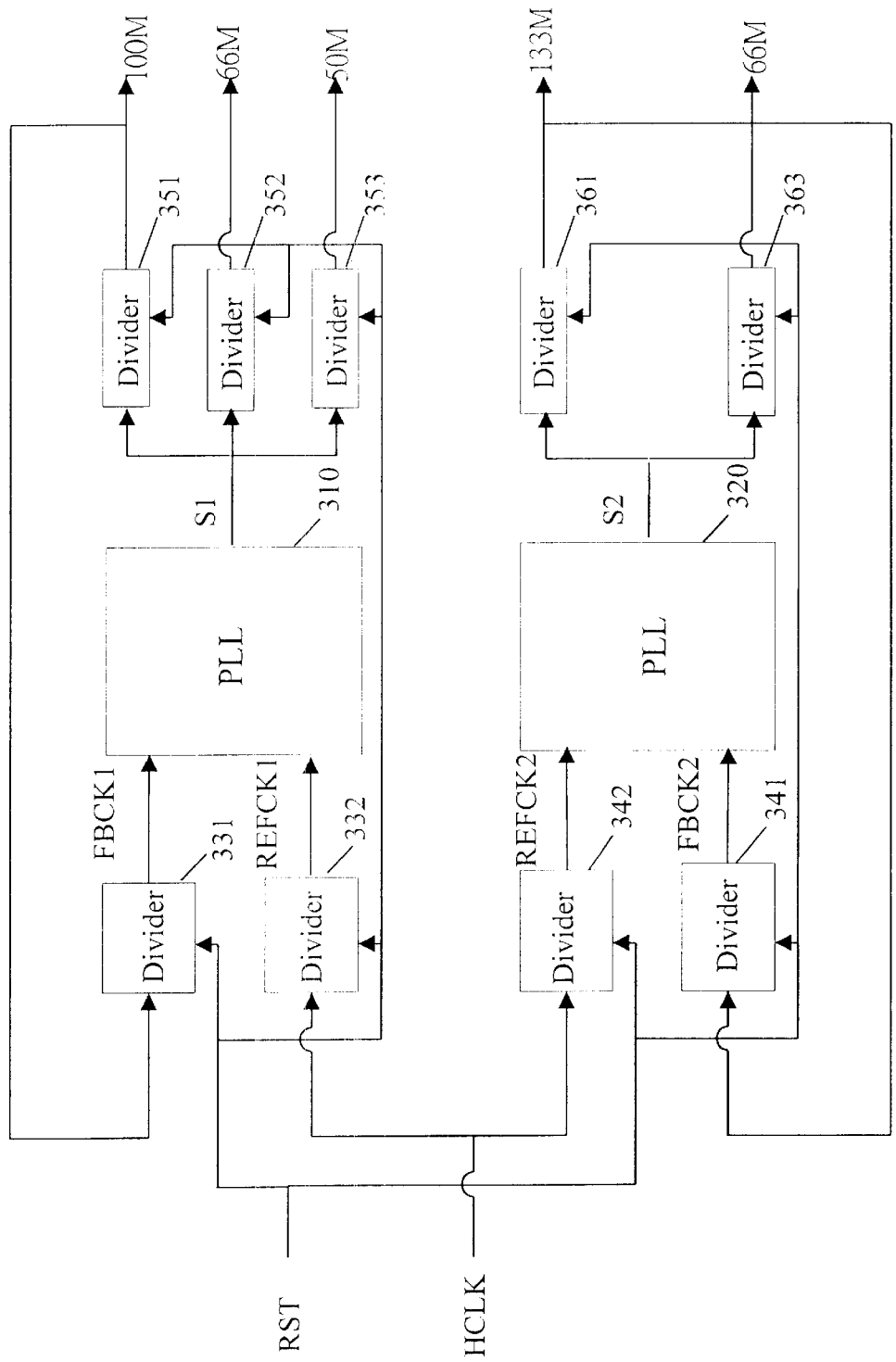
FIG. 3 shows the block diagram of the clock generating apparatus according to the preferred embodiment of the invention.

Referring to FIG. 3, the clock generating apparatus according to the preferred embodiment of the invention includes a main clock signal HCLK, a reset signal RST, two PLLs 310 and 320, a number of dividers 331, 332, 341, 342, 351, 352, 353, 361, and 363. The dividers 351 and 361 are Divide-by-2 dividers. The dividers 331, 332, 342, and 352 are Divide-by-3 dividers. The dividers 341, 353, and 363 are Divide-by-4 dividers. In order to align the phases of the generated clock signals with that of the main clock signal HCLK, a reset signal RST is utilized according to a preferred embodiment of the invention. As shown in FIG. 3, all dividers receive the reset signal RST. Besides, the dividers 331, 332, 341, and 342 all receive the main clock signal HCLK.

The PLL 310 receives a feedback signal FBCK1 and a reference clock signal REFCK1 while the PLL 320 receives a feedback clock signal FBCK2 and a reference clock signal REFCK2.

Figure 4:
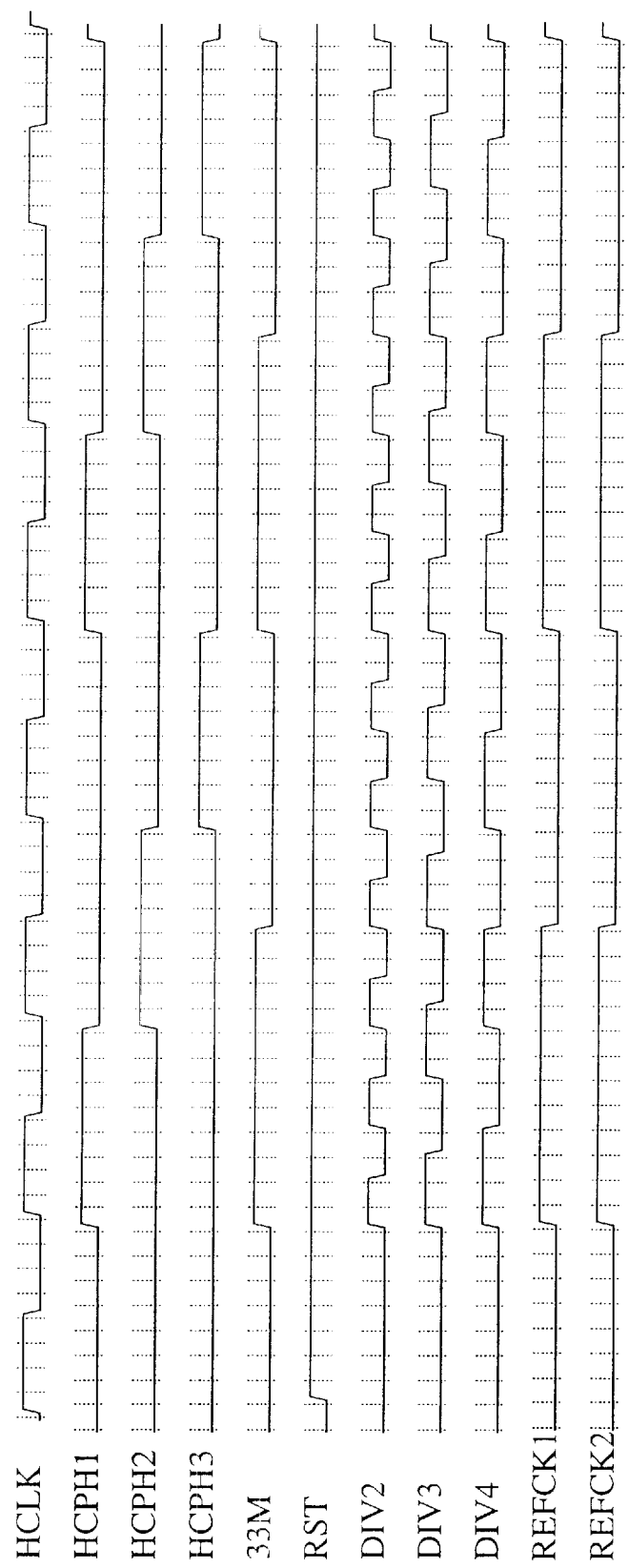
FIG. 4 shows the timing chart of the partial signals in FIG. 3.

The timing chart of the reset signal RST and the main clock signal HCLK is shown in FIG. 4. Here, when a signal is at high level, it is valid. Besides, the frequency of the clock signals according to the preferred embodiment of the invention are multiples of 33 MHz. Therefore, 33 MHz is called the base band signal in the preferred embodiment of the invention. Furthermore, the clock signals of 100 MHz, 66 MHz, and 33 MHz are the output signals of the respective dividers 351, 352, and 353 shown in FIG. 3. The clock signals 133 MHz, and 66 MHz are the output signals of the dividers 361, and 363. Because the frequency of the output signals of the dividers 352 and 363 are both 66 MHz, they combine into one signal in FIG. 5. The main clock signal HCLK of 100 MHz is taken as an example. Because 100 MHz is about 3 times of 33 MHz, the main clock signal HCLK has three phase signals HCPH1, HCPH2, and HCPH3 as shown in FIG. 4. It needs to be mentioned that the invention can be applied to other clock signals of different frequency, which is within the scope of the invention.

According to a preferred embodiment of the invention, the reset signal RST is utilized to reset all the dividers in order to align the phases of all the clock signals. The reset signal RST is set to be valid at high level at high level, when the last phase signal of the main clock signal HCLK, for example, the third phase signal HCPH3, is valid. As a result, all the clock signals can be valid when the first phase signal HCPH1 is valid as shown in FIG. 4.

Referring to FIG. 3, the reference signals REFCK1, and REFCK2 are the output signals of the dividers 332, and 342 after the dividers 332 and 342 receive the reset signal RST and the main clock signal HCLK. As mentioned above, after the dividers 332 and 342 are reset by the reset signal RST, the main clock signal HCLK is divided to gain the reference clock signals REFCK1 and REFCK2 when the first phase signal HCPH1 of the main clock signal is enabled. Hence, in the timing chart shown in FIG. 4, the reference clock signals REFCK1 and REFCK2 are at high level when the first phase signal HCPH1 of the main clock signal HCLK is enabled. In addition, the reference clock signals REFCK1 and REFCK2 are the outputs of the dividers 331 and 341 after the dividers 331 and 341 receive the main clock signal HCLK. Therefore, the frequency of the reference clock signals REFCK1 and REFCK2 are both 33 MHz, which is about one third of 100 MHz.

When the reference clock signals REFCK1 and REFCK2 are enabled, the phase-locked operation is undertaken by the PLLs 310 and 320. The details of the phase-locked operation are described in the Description of the Related Art and therefore will not be repeated herein. The following description is the timing of the clock signals after the phase-locked operation of the PLLs 310 and 320.

The phase-locked operation is undertaken by the PLL 310 when the reference clock signal REFCK1 is at high level. When the PLL 310 is phase-locked, the frequency of the feedback clock signal FBCK1 is the same as that of the reference clock signal REFCK1, that is, 33 MHz. Hence, the frequency of the output clock signal S1 outputted by the PLL 310 is the frequency of the feedback clock signal FBCK1× 2×3=33 MHz×2×3=200 MHz. Then, The frequency of the clock signal outputted by the divider 351 is 200 MHz/2=100 MHz. The frequency of the clock signal outputted by the divider 352 is 200 MHz/3=66 MHz. The frequency of the clock signal outputted by the divider 353 is 200 MHz/4=50 MHz.

In the same manner, when the PLL 320 is phase-locked, the clock signal S2 outputted by the PLL 320 is the frequency of the feedback clock signal FBCK×2×4=266 MHz. As a result, the frequency of the clock signal ouputted by the divider 361 is 266 MHz/2=133 MHz. The frequency of the clock signal outputted by the divider 363 is 266 MHz/4 =66 MHz.

Figure 5:
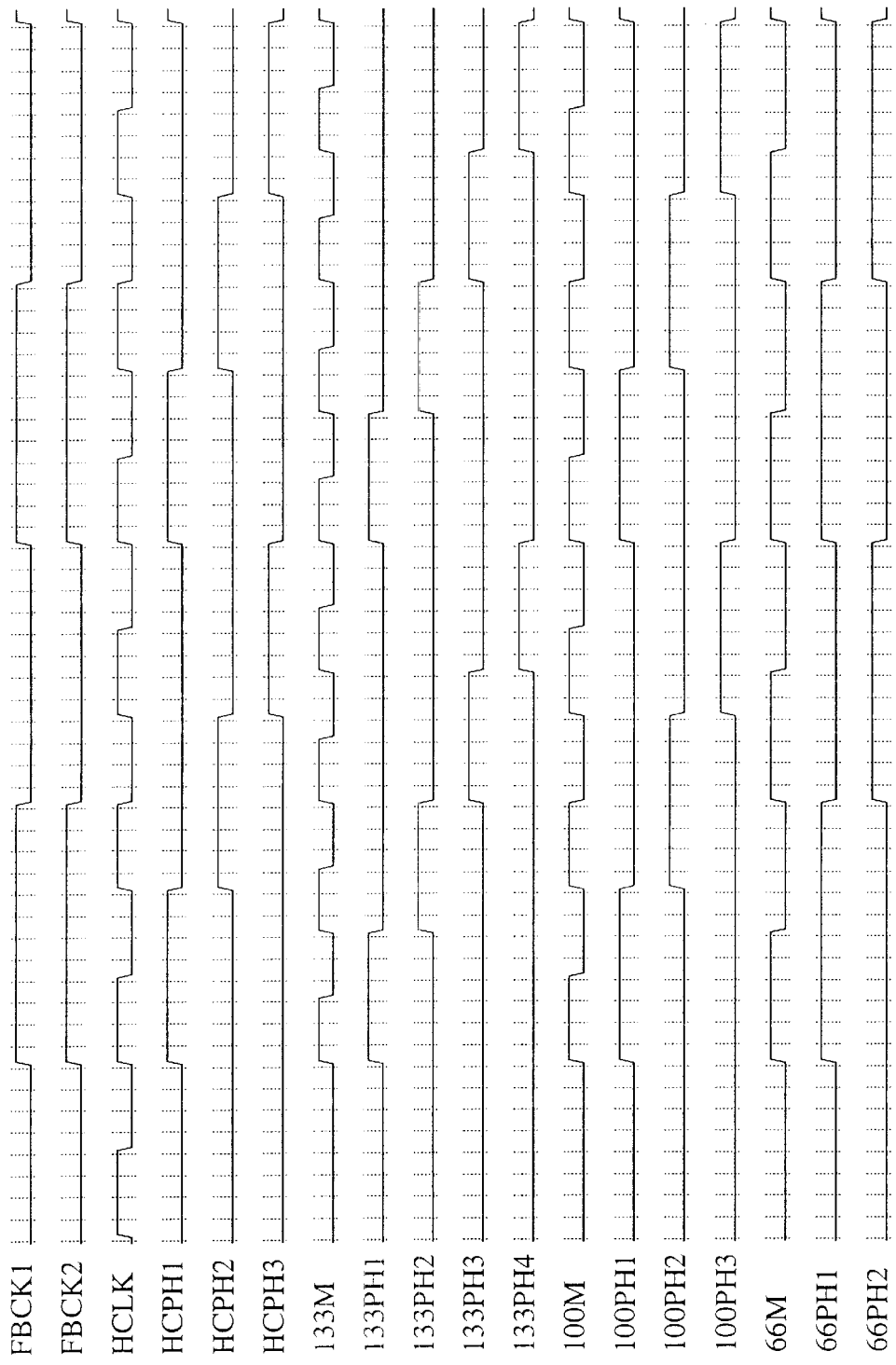
FIG. 5 shows the timing chart of the partial signals in FIG. 3.

The frequency of the three clock signals 133 MHz, 100 MHz, and 66 MHz are the multiples of the base-band frequency 33 MHz. That is, they are four times, triple, and twice of the base-band frequency. Referring to FIG. 5. The clock signal 133 MHz is provided with four phase signals, 133PH1, 133PH2, 133PH3, and 133PH4. The clock signal 100 MHz is provided with three phase signals, 100PH1, 100PH2, and 100PH3. The clock signal 66 MHz is provided with two phase signals, 66PH1, and 66PH2.

To illustrate the characteristic of the phase alignment, the timing of the main clock signal HCLK and its three phase signals HCPH1, HCPH2, and HCPH3 are also shown in FIG. 5. Referring to FIG. 5, the rising edges of the first phase signals 133PH1, 100PH1, and 66PH1 of the clock signals are the same as that of the first phase signal HCPH1 of the main clock signal HCLK. As a result, the clock signals generated according to the preferred embodiment of the invention are in phase alignment.

In the preferred embodiment of the invention, the frequency of the signals S1 and S2 outputted by the PLLs 310 and 320 are 200 MHz and 266 MHz, respectively. That is to say, the VCOs according to the preferred embodiment of the invention are oscillated at the frequency of 200 MHz and 266 MHz, respectively. As mentioned in the Description of the Related Art, the VCO is oscillated at the frequency of 400 MHz, which is less stable. In addition, the clock signals generated according to the invention are in phase alignment.

Obviously, utilizing all kinds of appreciate dividers and main clock signal to obtain various clock signals is within the spirits and scope of the invention. Moreover, to obtain more clock signals of different frequency, the third or even the fourth PLL can be used. Besides, more dividers can be added to the outputs of the PLLs, too.

One of the characteristics of the invention is that the reset signal is utilized to reset the dividers. The reset signal is enabled when the last phase signal of the main clock signal is enabled. All kinds of the clock signals can be achieved by utilizing any appropriate combination of the dividers and PLLs. Besides, the clock signals are in phase alignment. Moreover, the clock generating apparatus is more stable because the PLLs are not oscillated at high frequency.

While the invention has been described by way of example and in terms of the preferred embodiment, it is to be understood that the invention is not limited to the disclosed embodiment. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A clock generating apparatus for receiving a main clock signal and a reset signal and outputting a plurality of clock signals, wherein the main clock signal is provided with m phase signals, the m phase signals are enabled in turn during the m periods of the main clock signals, each of the m phase signals is enabled in one period of the main clock signal, m is a integer, and the reset signal is enabled when the $m^{th}$ phase signal of the main clock signal is enabled, the clock generating apparatus comprising:

a first divider for receiving the main clock signal and the reset signal, wherein after the first divider is reset by the reset signal, on condition that the first phase signal is enabled, the first divider divides the main clock signal and outputs a reference clock signal;

a first phase-locked loop (PLL) for receiving the reference clock signal and a first feedback clock signal and outputting a first clock signal;

a second phase-locked loop (PLL) for receiving the reference clock signal and a second feedback clock signal and outputting a second clock signal;

a second divider for receiving the reset signal and the first clock signal, wherein after the second divider is reset by the reset signal, on condition that the first phase signal is enabled, the second divider divides the first clock signal and outputs a third clock signal;

a third divider for receiving the reset signal and the second clock signal, wherein after the third divider is reset by the reset signal, on condition that the first phase signal is enabled, the third divider divides the second clock signal and outputs a forth clock signal;

a forth divider for receiving the reset signal and the third clock signal, wherein after the forth divider is reset by the reset signal, on condition that the first phase signal is enabled, the forth divider divides the third clock signal and outputs the first feedback clock signal; and a fifth divider for receiving the reset signal and the forth clock signal, wherein after the fifth divider is reset by the reset signal, on condition that the first phase signal is enabled, the fifth divider divides the forth clock signal and outputs the second feedback clock signal;

wherein the frequency of the first feedback clock signal and the second feedback clock signal are the same as that of the reference clock signal, and the third clock signal, the forth clock signal, and the main clock signal are in phase alignment.

2. The clock generating apparatus according to claim 1, wherein the frequency of the main clock signal is 100 MHz.

3. The clock generating apparatus according to claim 2, wherein the frequency of the reference clock signal, the first feedback clock signal, and the second feedback signal is 33 MHz.

4. The clock generating apparatus according to claim 3, wherein m=3.

5. The clock generating apparatus according to claim 3, wherein the first divider is a divide-by-3 divider.

6. The clock generating apparatus according to claim 3, wherein the frequency of the first clock signal is 200 MHz.

7. The clock generating apparatus according to claim 3, wherein the frequency of the second clock signal is 266 MHz.

8. The clock generating apparatus according to claim 3, wherein the second divider is a divide-by-2 divider, and the frequency of the third clock signal is 100 MHz.

9. The clock generating apparatus according to claim 3, wherein the third divider is a divide-by-2 divider, and the frequency of the forth clock signal is 133 MHz.

10. The clock generating apparatus according to claim 3, wherein the forth divider is a divide-by-3 divider.

11. The clock generating apparatus according to claim 3, wherein the fifth divider is a divide-by-4 divider.

12. A clock generating apparatus comprising:

a main clock signal;

m phase signals, wherein the period of each of the m phase signals is equal to m times of the period of the main clock, m is an integer, and each of the m phase signals is enabled in one period of the main clock signal;

a reset signal, which is enabled when the $m^{th}$ phase signal of the phase signals is enabled;

a reference clock signal, which is generated from dividing the main clock signal under the control of the rest signal when the first phase signal of the phase signals is enabled, the frequency of the reference clock signal is m times frequency of the main clock signal;

a first clock signal, which is generated after phase locked of the reference clock signal and a feedback clock signal;

a second clock signal, which is generated after phase locked of the reference signal and a second feedback clock signal;

a third clock signal, which is generated by dividing the first clock signal under the control of the reset signal when the first phase signal is enabled; and a forth clock signal, which is generated by dividing the second clock signal under the control of the reset signal when the first phase signal is enabled;

wherein the frequency of the first feedback clock signal and the second feedback clock signal are the same as that of the reference clock signal, and the third clock signal, the forth clock signal, and the main clock signal are in phase alignment.

13. The clock generating apparatus according to claim 12, wherein the frequency of the reference clock signal, the first feedback clock signal, and the second feedback signal is 33 MHz.

14. The clock generating apparatus according to claim 13, wherein the frequency of the main clock signal is 100 MHz.

15. The clock generating apparatus according to claim 14, wherein m=3.

16. The clock generating apparatus according to claim 14, wherein the frequency of the first clock signal is 200 MHz.

17. The clock generating apparatus according to claim 14, wherein the frequency of the second clock signal is 266 MHz.

18. The clock generating apparatus according to claim 14, wherein the third clock signal is 100 MHz.

19. The clock generating apparatus according to claim 14, wherein the forth clock signal is 133 MHz.

20. A clock generating method for receiving a main clock signal and a reset signal and outputting a plurality of clock signals, the clock generating method comprising the following steps:

generating m phase signals, wherein the period of each of the m phase signals is m times of the period of the main clock signal, m is an integer, each of the m phase signals is enabled during one period of the main clock signal, and the reset signal is enabled when the $m^{th}$ phase signal is enabled;

receiving the main clock signal and the reset signal by a first divider, wherein the first divider divides the main clock signal after being reset by the reset signal and outputs a reference clock signal when the first phase signal is enabled;

receiving the reference clock signal and a first feedback signal by a first phase-locked loop (PLL) and outputting a first clock signal;

receiving the reference clock signal and a second feedback signal by a second phase-locked loop (PLL) and outputting a second clock signal;

receiving the reset signal and the first clock signal by a second divider, wherein the second divider divides the first clock signal after being reset by the reset signal and outputs the first feedback clock signal when the first phase signal is enabled;

receiving the reset signal and the second clock signal by a third divider, wherein the third divider divides the second clock signal after being reset by the reset signal and outputs the second feedback clock signal when the first phase signal is enabled;

receiving the reset signal and the third clock signal by a forth divider, wherein the forth divider divides the third clock signal after being reset by the reset signal and outputs a third clock signal when the first phase signal is enabled; and receiving the reset signal and the forth clock signal by a fifth divider, wherein the fifth divider divides the forth clock signal after being reset by the reset signal and outputs a forth clock signal when the first phase signal is enabled;

wherein the frequency of the first feedback clock signal and the second feedback clock signal are the same as that of the reference clock signal, and the third clock signal, the forth clock signal, and the main clock signal are in phase alignment.

21. The clock generating method according to claim 20, wherein the frequency of the main clock signal is 100 MHz.

22. The clock generating method according to claim 21, wherein the reference clock signal, the first feedback clock signal, and the frequency of the second clock signal is 33 MHz.

23. The clock generating method according to claim 22, wherein m=3.

24. The clock generating method according to claim 22, wherein the first divider is a divide-by-3 divider.

25. The clock generating method according to claim 22, wherein the frequency of the first clock signal is 200 MHz.

26. The clock generating method according to claim 22, wherein the frequency of the second clock signal is 266 MHz.

27. The clock generating apparatus according to claim 22, wherein the second divider is a divide-by-2 divider, and the frequency of the third clock signal is 100 MHz.

28. The clock generating method according to claim 22, wherein the third divider is a divide-by-2 divider, and the frequency of the forth clock signal is 133 MHz.

29. The clock generating method according to claim 22, wherein the forth divider is a divide-by-3 divider.

30. The clock generating method according to claim 22, wherein the fifth divider is a divide-by-4 divider.

31. A clock generating apparatus for receiving a main clock signal and a reset signal and outputting a plurality of clock signals, wherein the main clock signal is provided with m phase signals, the m phase signals are enabled in turn during the m periods of the main clock signals, each of the m phase signals is enabled in one period of the main clock signal, m is a integer, and the reset signal is enabled when the me phase signal of the main clock signal is enabled, the clock generating apparatus comprising:

a first divider for receiving the main clock signal and the reset signal, wherein the first divider divides the main clock signal after being reset by the reset signal, and outputs a first reference clock signal when the first phase signal of the main clock signal is enabled;

a second divider for receiving the main clock signal and the reset signal, wherein the second divider divides the main clock signal after being reset by the reset signal, and outputs a second reference clock signal when the first phase signal of the main clock signal is enabled;

a first phase-locked loop (PLL) for receiving the first reference clock signal and a first feedback clock signal, and outputting a first clock signal;

a second phase-locked loop (PLL) for receiving the second reference clock signal and a second feedback clock signal, and outputting a second clock signal;

a third divider for receiving the reset signal and the first clock signal, wherein the third divider divides the first clock signal after being reset by the reset signal, and outputs a third clock signal when the first phase signal of the main clock signal is enabled;

a forth divider for receiving the reset signal and the second clock signal, wherein the forth divider divides the second clock signal after being reset by the reset signal, and outputs a forth clock signal when the first phase signal of the main clock signal is enabled;

a fifth divider for receiving the reset signal and the third clock signal, wherein the fifth divider divides the third clock signal after being reset by the reset signal, and outputs the first feedback clock signal when the first phase signal of the main clock signal is enabled; and a sixth divider for receiving the reset signal and the forth clock signal, wherein the sixth divider divides the forth clock signal after being reset by the reset signal, and outputs the second feedback clock signal when the first phase signal of the main clock signal is enabled;

wherein the frequency of the first feedback clock signal and the second feedback clock signal are the same as that of the reference clock signal, and the third clock signal, the forth clock signal, and the main clock signal are in phase alignment.

32. The clock generating apparatus according to claim 31, wherein the frequency of the main clock signal is 100 MHz.

33. The clock generating apparatus according to claim 32, wherein the frequency of the first reference clock signal, the second reference clock signal, the first feedback clock signal, and the second clock signal is 33 MHz.

34. The clock generating apparatus according to claim 32, wherein m=3.35.

35. The clock generating apparatus according to claim 32, wherein the first divider is a divide-by-3 divider.

36. The clock generating apparatus according to claim 32, wherein the second divider is a divide-by-3 divider.

37. The clock generating apparatus according to claim 32, wherein the frequency of the first clock signal is 200 MHz.

38. The clock generating apparatus according to claim 32, wherein the frequency of the second clock signal is 266 MHz.

39. The clock generating apparatus according to claim 32, wherein the third divider is a divide-by-2 divider, and the frequency of the third clock signal is about 100 MHz.

40. The clock generating apparatus according to claim 32, wherein the forth divider is a divide-by-2 divider, and the frequency of the forth clock signal is about 133 MHz.

41. The clock generating apparatus according to claim 32, wherein the fifth divider is a divide-by-3 divider.

42. The clock generating apparatus according to claim 32, wherein the sixth divider is a divide-by-4 divider.

43. A clock generating method for receiving a main clock signal and a reset signal and outputting a plurality of clock signals, the clock generating method comprising the following steps:

generating m phase signals, wherein the period of each of the m phase signals is m times of the period of the main clock signal, m is an integer, each of the m phase signals is enabled during one period of the main clock signal, and the reset signal is enabled when the $m^{th}$ phase signal is enabled;

receiving the main clock signal and the reset signal by a first divider, wherein the first divider divides the main clock signal after being reset by the reset signal, and outputs a first reference clock signal when the first phase signal is enabled;

receiving the main clock signal and the reset signal by a second divider, wherein the second divider divides the main clock signal after being reset by the reset signal, and outputs a second reference clock signal when the first phase signal is enabled;

receiving the first reference clock signal and a first feedback signal by a first phase-locked loop (PLL), and outputting a first clock signal;

receiving the second reference clock signal and a second feedback signal by a second phase-locked loop (PLL), and outputting a second clock signal;

receiving the reset signal and the first clock signal by a third divider, wherein the third divider divides the first clock signal after being reset by the reset signal, and outputs the first feedback clock signal when the first phase signal is enabled;

receiving the reset signal and the second clock signal by a forth divider, wherein the forth divider divides the second clock signal after being reset by the reset signal, and outputs the second feedback clock signal when the first phase signal is enabled;

receiving the reset signal and the third clock signal by a fifth divider, wherein the fifth divider divides the third clock signal after being reset by the reset signal, and outputs a third clock signal when the first phase signal is enabled; and receiving the reset signal and the forth clock signal by a sixth divider, wherein the sixth divider divides the forth clock signal after being reset by the reset signal, and outputs a forth clock signal when the first phase signal is enabled;

wherein the frequency of the first reference clock signal, the second reference clock signal, the first feedback clock signal, and the second feedback clock signal are the same, and the third clock signal, the forth clock signal, and the main clock signal are in phase alignment.

44. The clock generating method according to claim 43, wherein the frequency of the main clock signal is 100 MHz.

45. The clock generating apparatus according to claim 44, wherein the frequency of the first reference clock signal, the second reference clock signal, the first feedback clock signal, and the second clock signal is 33 MHz.

46. The clock generating method according to claim 44, wherein m=3.

47. The clock generating apparatus according to claim 44, wherein the first divider is a divide-by-3 divider.

48. The clock generating apparatus according to claim 44, wherein the second divider is a divide-by-3 divider.

49. The clock generating apparatus according to claim 44, wherein the frequency of the first clock signal is 200 MHz.

50. The clock generating apparatus according to claim 44, wherein the frequency of the second clock signal is 266 MHz.

51. The clock generating apparatus according to claim 44, wherein the third divider is a divide-by-2 divider, and the frequency of the third clock signal is about 100 MHz.

52. The clock generating apparatus according to claim 44, wherein the forth divider is a divide-by-2 divider, and the frequency of the forth clock signal is 133 MHz.

53. The clock generating apparatus according to claim 44, wherein the fifth divider is a divide-by-3 divider.

54. The clock generating apparatus according to claim 44, wherein the sixth divider is a divide-by-4 divider.

* * * * *